United States Patent
Fry et al.

(10) Patent No.: US 10,957,622 B2
(45) Date of Patent: Mar. 23, 2021

(54) SPATIALLY LOCALIZED THERMAL INTERFACE MATERIALS

(71) Applicant: INTERNATIONAL BUSINESS MACHINES CORPORATION, Armonk, NY (US)

(72) Inventors: Jonathan R. Fry, Fishkill, NY (US); Michael Rizzolo, Delmar, NY (US); Tuhin Sinha, Oradell, NJ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 41 days.

(21) Appl. No.: 16/358,648

(22) Filed: Mar. 19, 2019

(65) Prior Publication Data

US 2020/0303282 A1 Sep. 24, 2020

(51) Int. Cl.
*H01L 23/34* (2006.01)
*H01L 23/373* (2006.01)

(52) U.S. Cl.
CPC ...... *H01L 23/3738* (2013.01); *H01L 23/3735* (2013.01); *H01L 23/3732* (2013.01)

(58) Field of Classification Search
CPC ............ H01L 23/3672; H01L 23/3735; H01L 2924/01049; H01L 23/3737; H01L 23/49833; H01L 23/5389; H01L 23/49575; H01L 33/641; H01L 23/3121; H01L 23/345; H01L 23/3733; H01L 23/14; H01L 23/3731; H01L 23/3738; H01L 23/52

USPC .......................................................... 257/713
See application file for complete search history.

(56) References Cited

U.S. PATENT DOCUMENTS

| | | | |
|---|---|---|---|
| 6,143,076 A | 11/2000 | Rasmussen et al. | |
| 7,579,686 B2 | 8/2009 | Hu et al. | |
| 7,833,839 B1* | 11/2010 | Touzelbaev | H01L 24/28 438/122 |
| 7,875,972 B2 | 1/2011 | Jadhav et al. | |
| 7,876,565 B2 | 1/2011 | Hoivik et al. | |
| 8,063,483 B2 | 11/2011 | Dirnitrakopoulos et al. | |
| 2005/0175838 A1 | 8/2005 | Greinke et al. | |
| 2005/0211427 A1 | 9/2005 | Kenny et al. | |
| 2008/0111234 A1* | 5/2008 | Hua | H01L 23/367 257/713 |
| 2010/0321897 A1 | 12/2010 | Hill et al. | |
| 2017/0342550 A1 | 11/2017 | Siegal et al. | |
| 2017/0347492 A1 | 11/2017 | Cola et al. | |
| 2020/0066669 A1* | 2/2020 | Fry | H01L 24/32 |

* cited by examiner

*Primary Examiner* — Theresa T Doan
(74) *Attorney, Agent, or Firm* — Law Offices of Ira D. Blecker, P.C.

(57) ABSTRACT

A semiconductor device that includes a semiconductor substrate having a surface, the surface having several regions having different thermal and/or mechanical requirements; and a composite thermal interface material including several spatially localized thermal interface materials placed on the surface, each of the several thermal interface materials tailored to the different thermal and/or mechanical requirements of each of the regions. Also disclosed is a method of forming the composite thermal interface material.

18 Claims, 8 Drawing Sheets

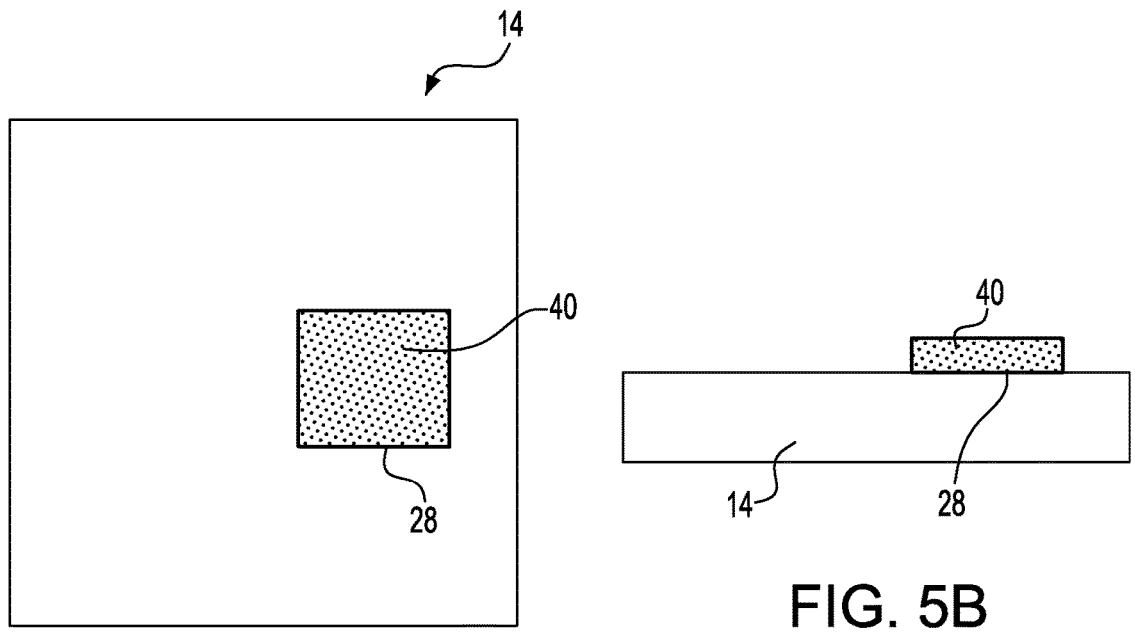
FIG. 5A
FIG. 5B
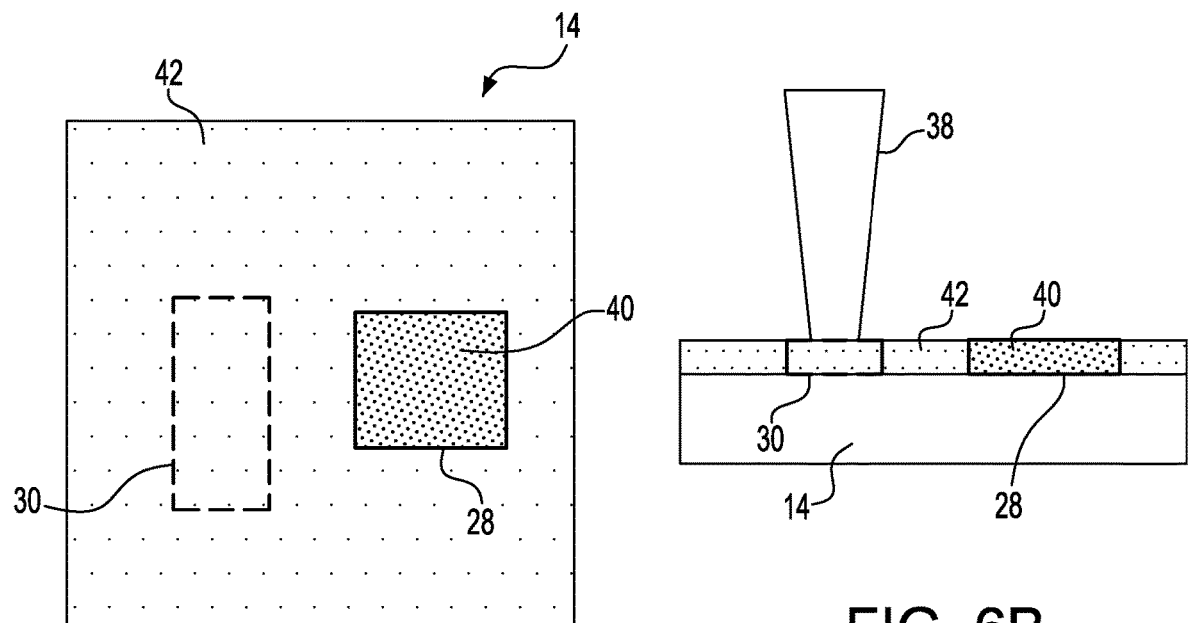
FIG. 6A
FIG. 6B

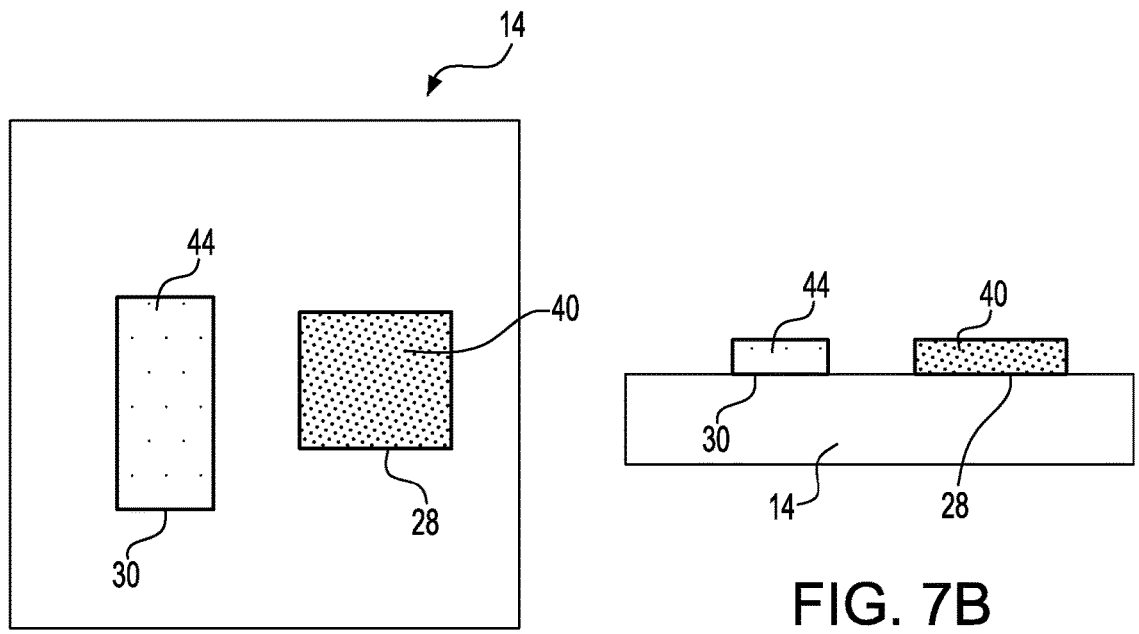
FIG. 7A
FIG. 7B
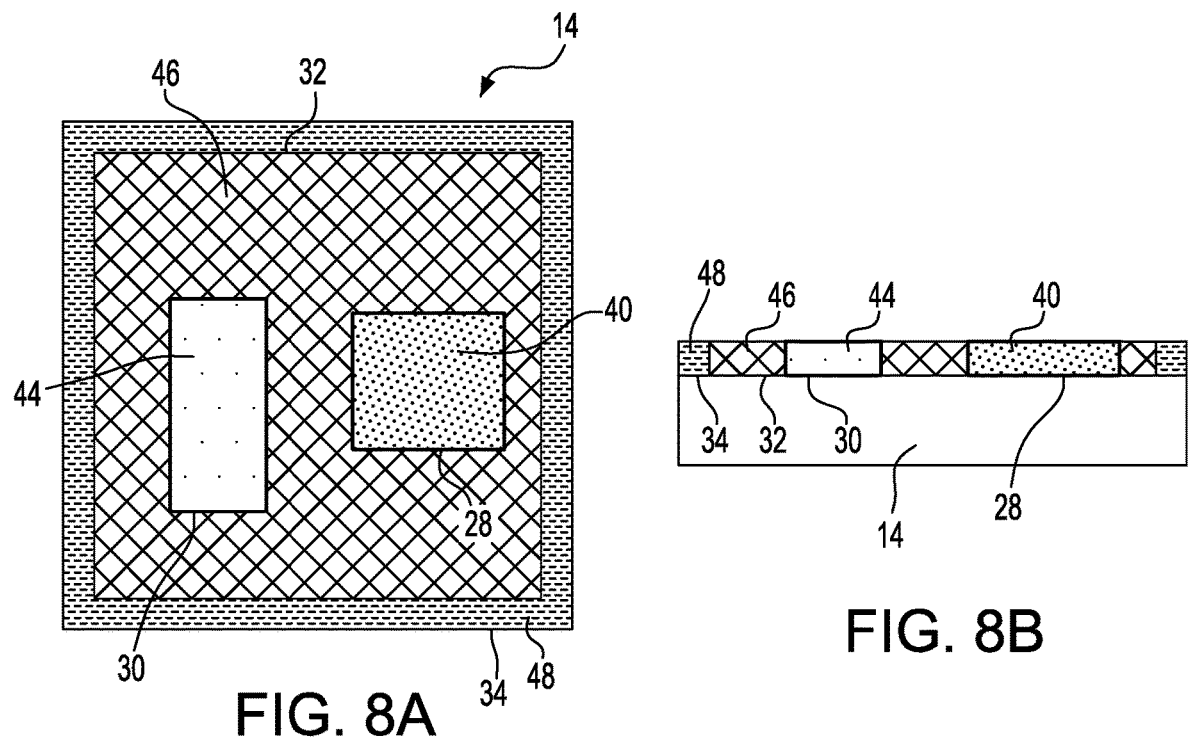
FIG. 8A
FIG. 8B

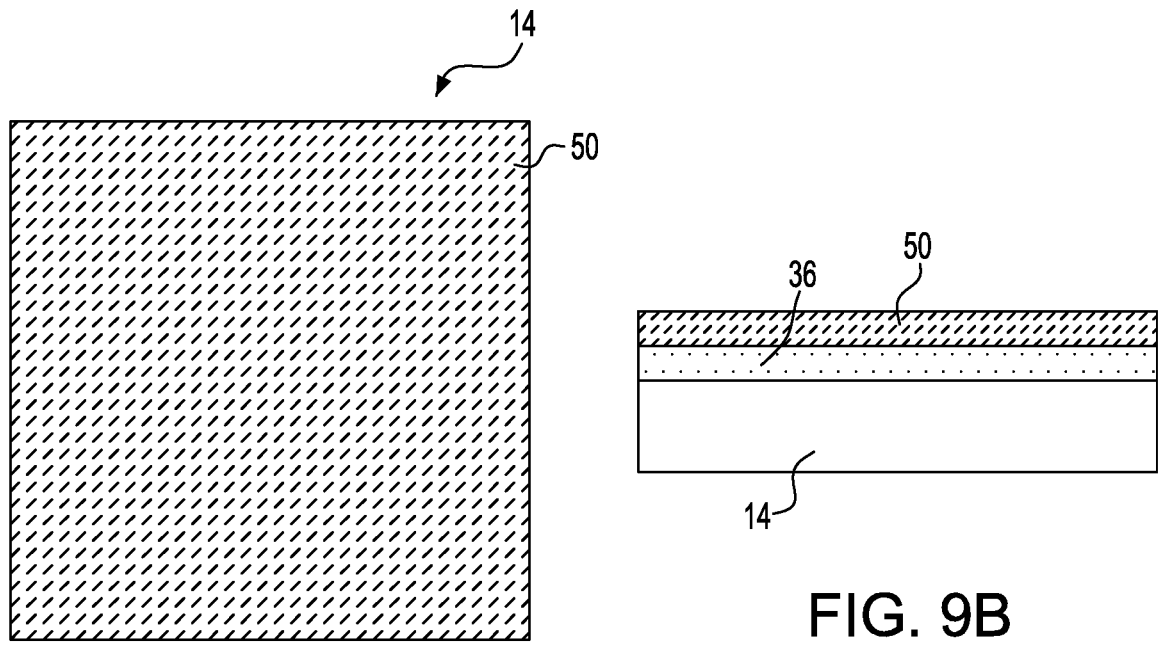
FIG. 9A
FIG. 9B
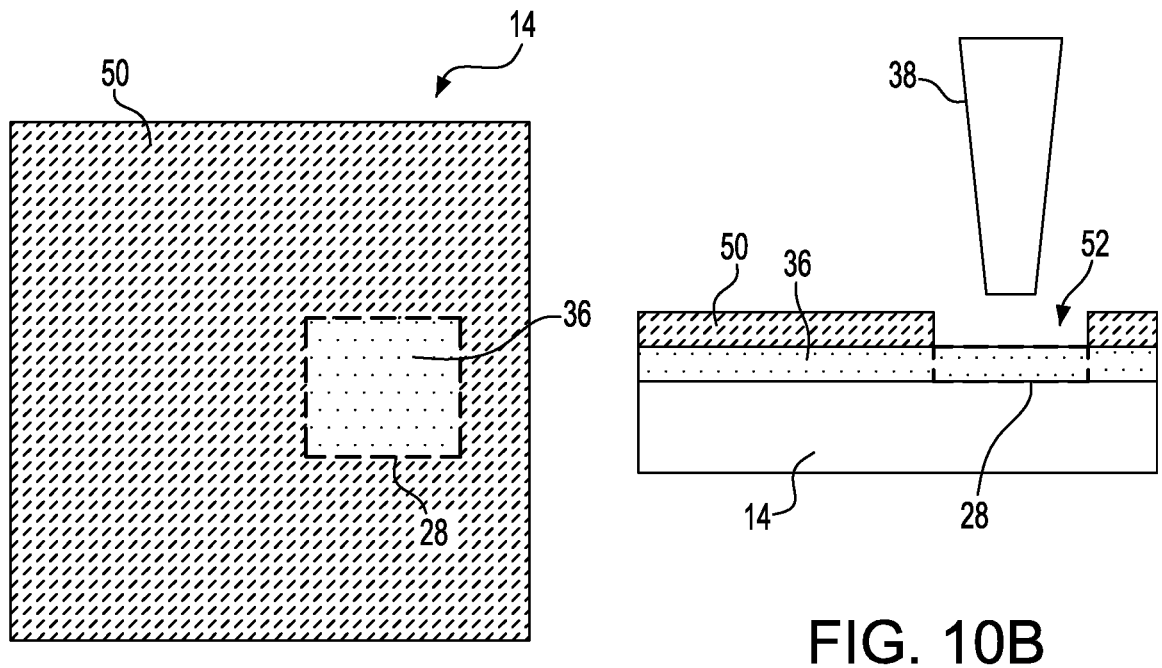
FIG. 10A
FIG. 10B

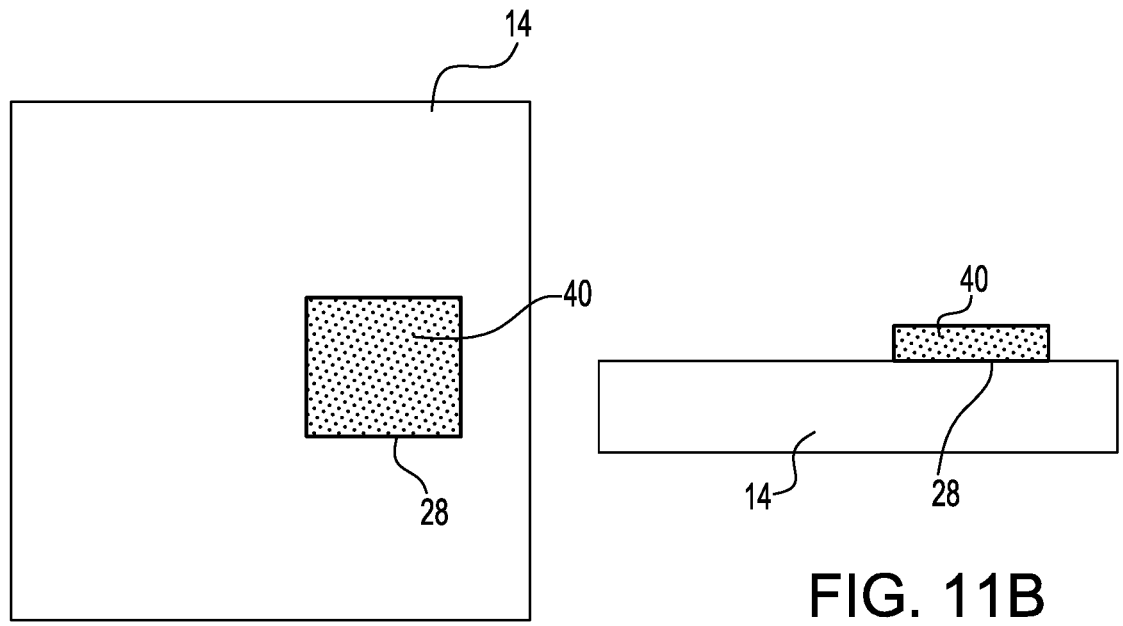
FIG. 11A
FIG. 11B
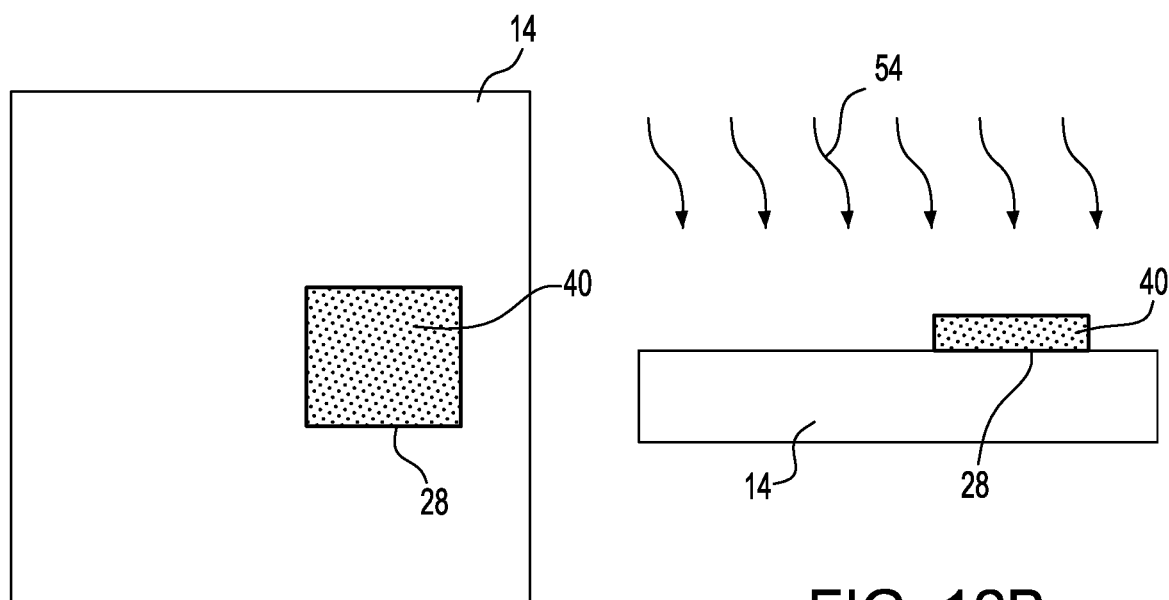
FIG. 12A
FIG. 12B

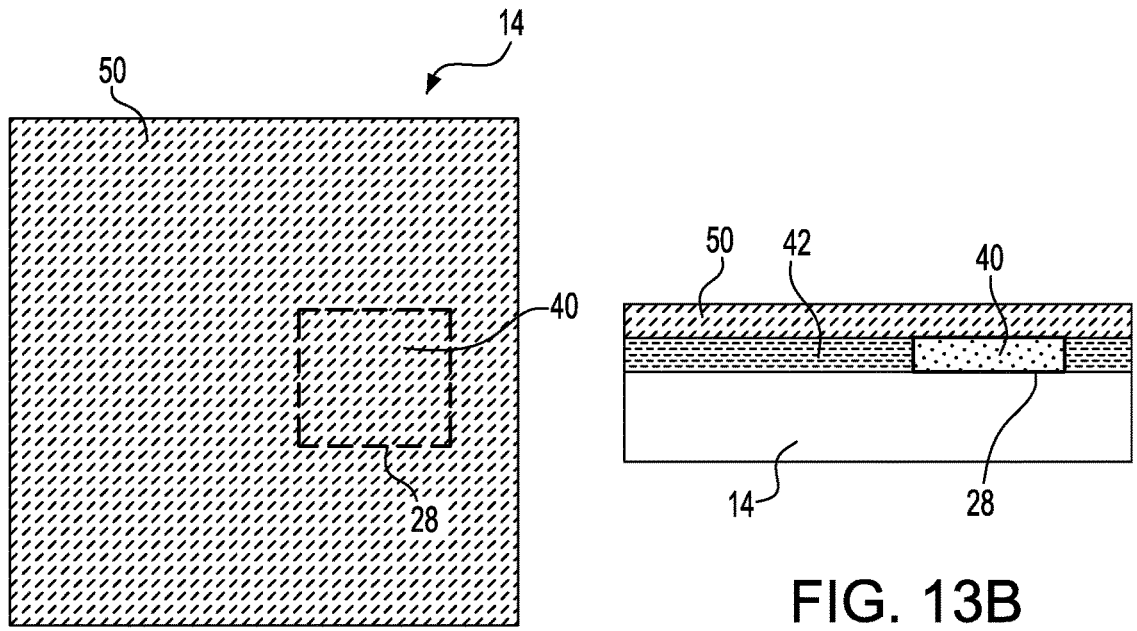
FIG. 13B
FIG. 13A
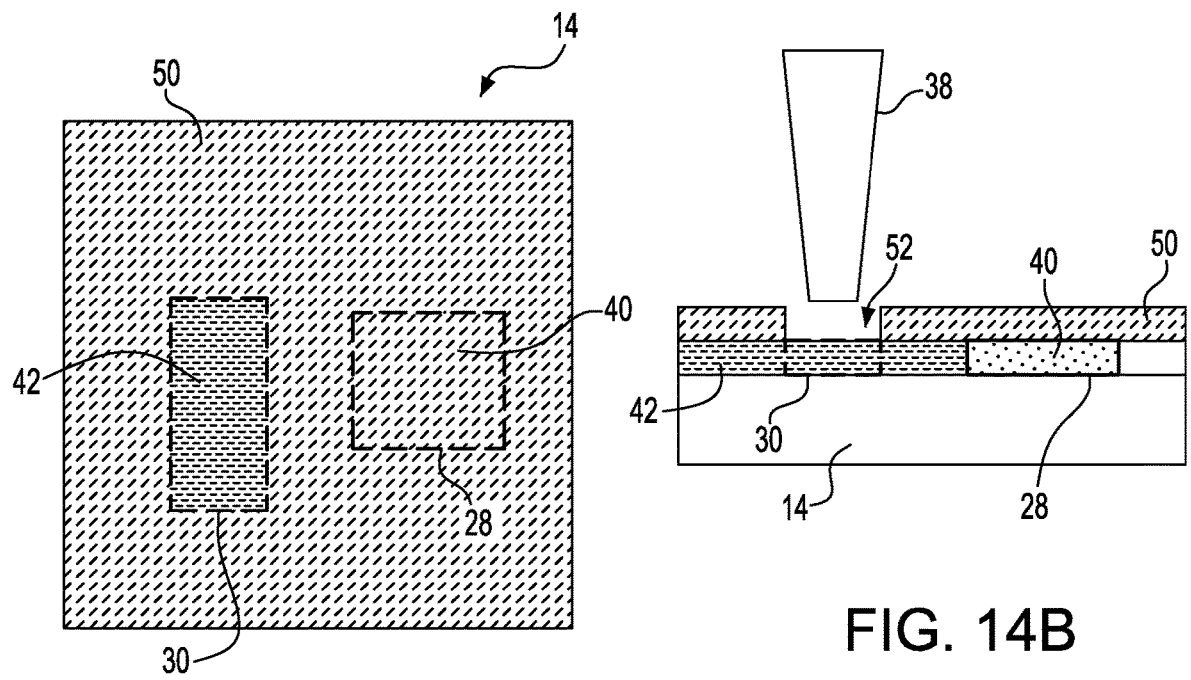
FIG. 14B
FIG. 14A

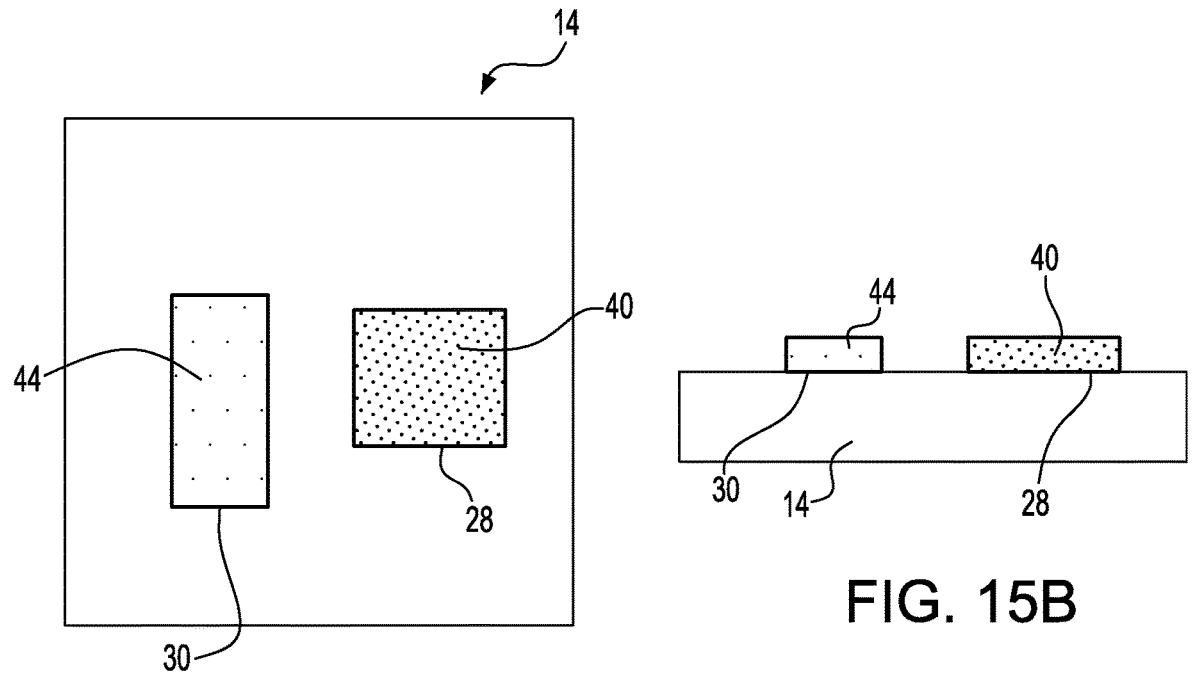
FIG. 15A
FIG. 15B
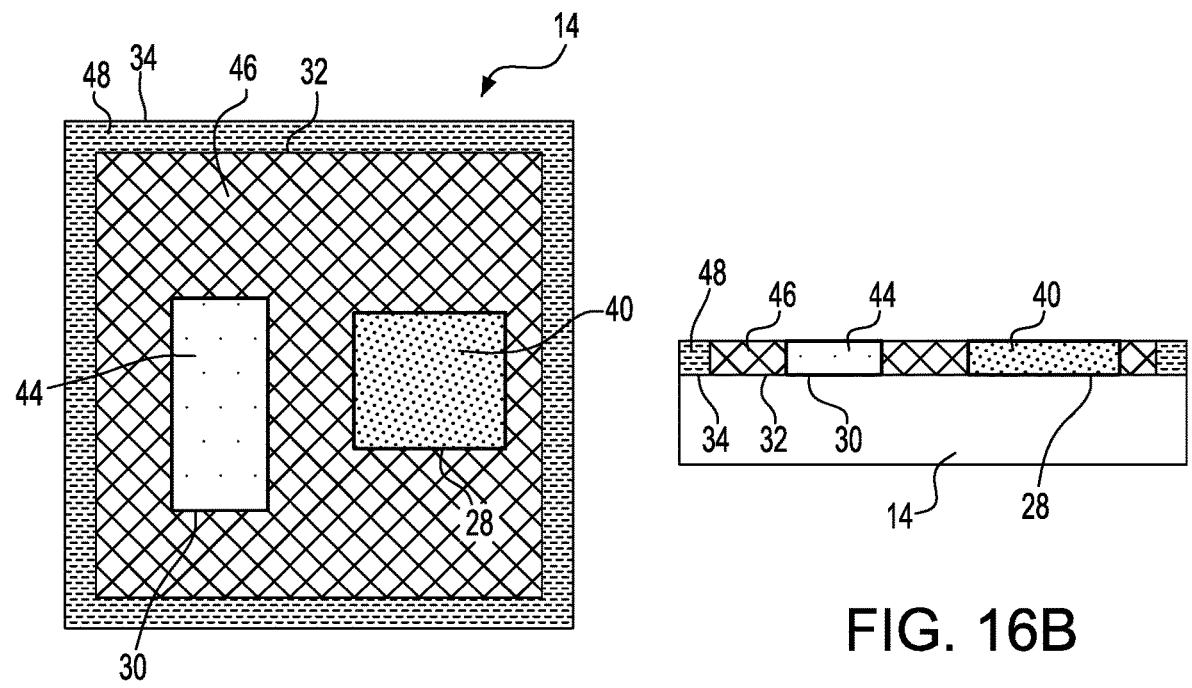
FIG. 16A
FIG. 16B

SPATIALLY LOCALIZED THERMAL INTERFACE MATERIALS

BACKGROUND

The present exemplary embodiments pertain to thermal solutions for semiconductor devices and, more particularly pertain to localizing thermal interface materials tailored to the thermal and/or mechanical requirements of the semiconductor devices.

The operation of semiconductor devices may cause localized hotspots which may limit the maximum clock frequencies of the semiconductor devices design. Current thermal management solutions require sedated operation of processor cores to remain within reliability constraints. Further, coefficient of thermal expansion mismatch and materials strength can cause mechanical failure, degraded reliability and warpage.

BRIEF SUMMARY

The various advantages and purposes of the exemplary embodiments as described above and hereafter are achieved by providing, according to an aspect of the exemplary embodiments, a semiconductor device comprising: a semiconductor substrate having a surface, the surface having a plurality of regions having different thermal and/or mechanical requirements; and a composite thermal interface material comprising a plurality of spatially localized thermal interface materials placed on the surface, each of the plurality of thermal interface materials tailored to the different thermal and/or mechanical requirements of each of the plurality of regions.

According to another aspect of the exemplary embodiments, there is provided a method of thermal interface material deposition on a surface of a semiconductor device comprising the steps of: depositing a thermal interface material on the surface of the semiconductor device, the thermal interface material selected from a plurality of thermal interface materials having different thermal conductivities; curing a portion of the deposited thermal interface material, a remaining portion of the deposited thermal interface material being uncured; stripping the remaining portion of the deposited thermal interface material to result in a spatially localized portion of cured thermal interface material; repeating the steps of depositing, curing and stripping such that each time the steps are repeated, a different thermal interface material is deposited, cured and stripped; and continuing the repeating until the surface of the semiconductor device is covered with the cured thermal interface materials to form a composite thermal interface material.

According to a further aspect of the exemplary embodiments, there is provided a method of thermal interface material deposition on a surface of a semiconductor device comprising the steps of: depositing a thermal interface material on the surface of the semiconductor device, the thermal interface material selected from a plurality of thermal interface materials having different thermal conductivities; depositing a lithographic masking material over the thermal interface material; forming an opening in the lithographic masking material to expose the underlying thermal interface material; curing a portion of the deposited thermal interface material through the opening in the lithographic masking material, a remaining portion of the deposited thermal interface material being uncured; stripping the lithographic masking material and the remaining portion of the deposited thermal interface material to result in a spatially localized portion of cured thermal interface material; repeating the steps of depositing a thermal interface material, depositing a lithographic masking material, curing and stripping such that each time the steps are repeated, a different thermal interface material is deposited, cured and stripped; and continuing the repeating until the surface of the semiconductor device is covered with the cured thermal interface materials to form a composite thermal interface material.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 3A and 3B to 8A and 8B illustrate an exemplary embodiment in which:

FIG. 3A is a plan view of a semiconductor device having a blanket layer of a first thermal interface material and FIG. 3B is a side view of the semiconductor device in FIG. 3A;

FIG. 5A is a plan view of the semiconductor device after removal of the uncured first thermal interface material leaving the portion of the at least partially cured first thermal interface material and FIG. 5B is a side view of the semiconductor device in FIG. 5A;

FIG. 6A is a plan view of the semiconductor device after repeating the steps illustrated in FIGS. 3A and 4A for a second thermal interface material and FIG. 6B is a side view of the semiconductor device in FIG. 6A;

FIG. 7A is a plan view of the semiconductor device after removal of the uncured second thermal interface material leaving the portion of the at least partially cured second thermal interface material and FIG. 7B is a side view of the semiconductor device in FIG. 7A;

FIG. 8A is a plan view of the semiconductor device after repeating the steps illustrated in FIGS. 3A to 5A for third and fourth thermal interface materials and FIG. 8B is a side view of the semiconductor device in FIG. 8A.

FIGS. 9A and 9B to 16A and 16B illustrate another exemplary embodiment in which:

FIG. 9A is a plan view of a semiconductor device having a blanket layer of a first thermal interface material and an over layer of a lithographic masking material and FIG. 9B is a side view of the semiconductor device in FIG. 9A;

FIG. 10A is a plan view of the semiconductor device after removing an uncured portion of the lithographic masking material and after having a portion of the first thermal interface material at least partially cured and FIG. 10B is a side view of the semiconductor device in FIG. 10A;

FIG. 11A is a plan view of the semiconductor device after removal of the remaining lithographic masking material and after removal of the uncured first thermal interface material leaving the portion of the at least partially cured first thermal interface material and FIG. 11B is a side view of the semiconductor device in FIG. 11A;

FIG. 12A is an optional step in which the partially cured first thermal interface material is heated to fully cure the first thermal interface material and FIG. 12B is a side view of the semiconductor device in FIG. 12A;

FIG. 13A is a plan view of the semiconductor device after repeating the step of depositing a lithographic masking material and FIG. 13B is a side view of the semiconductor device of FIG. 13A;

FIG. 14A is a plan view of the semiconductor device after repeating the steps illustrated in FIG. 10A for a second thermal interface material and FIG. 14B is a side view of the semiconductor device in FIG. 14A;

FIG. 15A is a plan view of the semiconductor device after removal of the remaining lithographic masking material and after removal of the uncured second thermal interface material leaving the portion of the at least partially cured second thermal interface material and FIG. 15B is a side view of the semiconductor device in FIG. 15A;

FIG. 16A is a plan view of the semiconductor device after repeating the steps illustrated in FIGS. 9A and 10A for third and fourth thermal interface materials and FIG. 16B is a side view of the semiconductor device in FIG. 16A.

DETAILED DESCRIPTION

Increases in particle density increase conductivity, but make the material more prone to mechanical failure Different areas of the semiconductor devices may experience different thermal and mechanical loads. For example, the processor core(s) of the semiconductor devices may require high thermal conductivity of the thermal interface material while the edges and corners of the semiconductor devices may require high mechanical compliance (low modulus). Using a single thermal interface to handle the high thermal conductivity of the processor core(s) and the high mechanical compliance of the edges and corners is not practical since increasing particle density in the thermal interface material to increase thermal conductivity may make the thermal interface material prone to mechanical failure at the edges and corners.

The present inventors are proposing a composite thermal interface material (TIM) to create tailored materials properties in different regions of the semiconductor devices. The use of multiple TIM materials in precise locations allows the balancing of local mechanical stresses versus thermal conductivity where needed. The exemplary embodiments allow precise targeting of hotspots and mechanical modulus control over die corners and die edges. The exemplary embodiments further allow the use of otherwise cost-prohibitive materials (e.g. diamond) in exact amounts rather than in the bulk material.

The unique method of creating spatially patterned thermal interface materials in the exemplary embodiments is different from a method where multiple thermal interface materials might be simply squeezed onto a semiconductor device, thereby resulting in unwanted interfacial voids between the dissimilar thermal interface material interfaces. The exemplary embodiments avoid the formation of interfacial voids.

Figure 1:
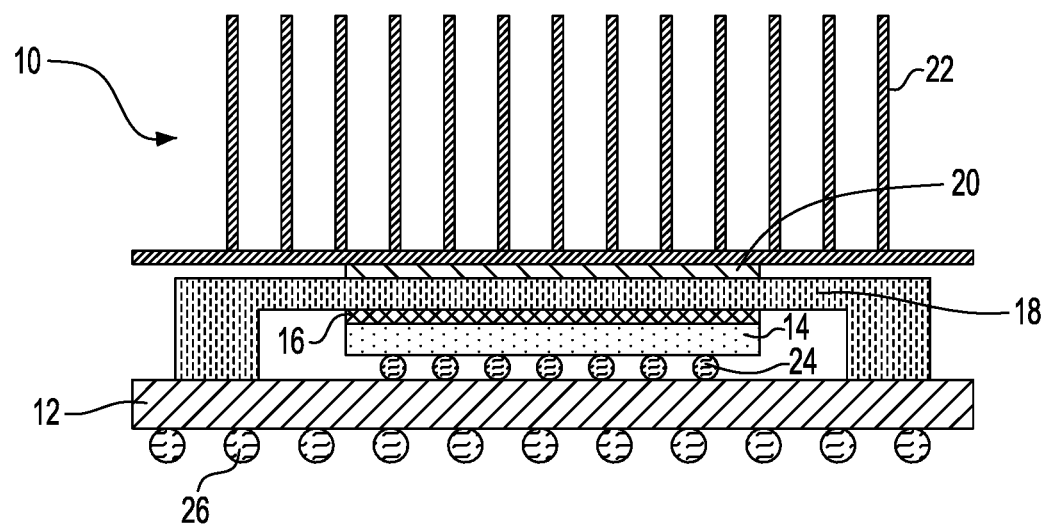
FIG. 1 is an illustration of a semiconductor module having a thermal interface material between a semiconductor device and a lid.

Referring to the Figures in more detail, and particularly referring to FIG. 1, there is illustrated, for the purpose of illustration and not limitation, a semiconductor module 10 that may include a package substrate 12 on which may be mounted a semiconductor device 14 (also known as a chip) that may be connected to the package substrate 12 by solder balls 24. The package substrate 12 may be connected to the next level of packaging by solder balls 26. The semiconductor device 14 may be enclosed on the package substrate 12 by a lid 18. To maintain good thermal conductivity between the semiconductor device 14 and the lid 18, a thermal interface material 16 may be inserted between the semiconductor device 14 and the lid 18. The semiconductor module 10 may further include a heat sink 22 and another thermal interface material 20 to provide good thermal conductivity between the heat sink 22 and the lid 18.

The exemplary embodiments are primarily concerned with the thermal interface material 16 and its capability to meet the thermal conductivity and/or mechanical requirements of the semiconductor device 14.

Figure 2:
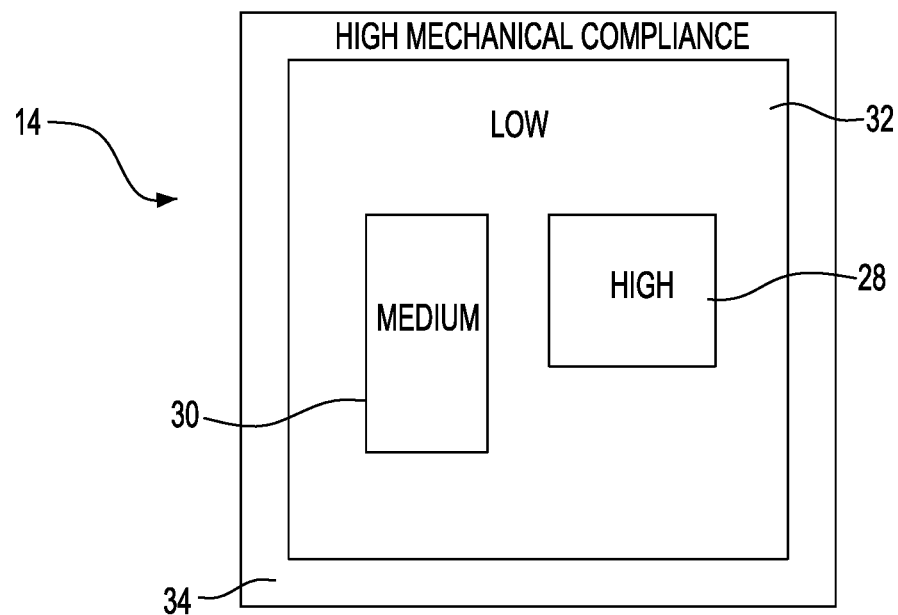
FIG. 2 is a plan view of a semiconductor device showing areas requiring thermal interface materials of different thermal conductivity and/or mechanical compliance.

FIG. 2 is a plan view of the semiconductor device 14 showing regions requiring thermal interface materials of different thermal conductivity and/or mechanical compliance. While FIG. 4 illustrate only four such regions, it should be understood that there may be more or less than the four regions. One region, labeled "high" 28 may be where the central processing unit(s) (also referred to the processing core(s)) is located. It is expected that the high region 28 will require a thermal interface material with high thermal conductivity.

Another region is "medium" 30 which may require a thermal interface material having medium thermal conductivity. The medium thermal conductivity is less than high thermal conductivity.

A third region may be "low" 32 which may require a thermal interface material having low thermal conductivity. The low thermal conductivity is less than medium thermal conductivity.

A fourth region may be "high mechanical compliance" 34. This fourth region is on the edges and corners of the semiconductor device 14 and may require a thermal interface material having high mechanical compliance (also referred to as low modulus) to be able to provide a cushion between the semiconductor device 14 and the lid 18 without damaging the edges and corners of the semiconductor device 14. The thermal interface material for the high mechanical compliance region 34 may also have low thermal conductivity.

The thermal conductivity and mechanical compliance of the thermal interface materials specified for the various region are described in relative terms but a person skilled in the art following the teachings herein has the ability to select the precise thermal interface material for each of the regions.

As noted above, the present inventors are proposing a composite thermal interface material (TIM) to create tailored materials properties in different regions of the semiconductor devices.

The thermal interface materials used in the exemplary embodiments are curable materials such as polysilicone or polyepoxy and may contain thermally conductive particles such as silver, alumina, graphene and diamond. The thermal conductivity and mechanical compliance of the thermal interface material may be adjusted by modulating the particle density. Typically, as the particle density increases, the thermal conductivity increases but the thermal interface materials become stiffer so as to lower their mechanical compliance. Conversely, as the particle density decreases, the thermal conductivity decreases but the mechanical compliance increases.

Some examples of commercially available thermal interface materials include Shinetsu 7935 for low to medium thermal conductivity and Dow Corning TC 3040 and Shinetsu 7772-4 for medium thermal conductivity. For high thermal conductivity, a thermal interface material such as Innovation Cooling IC Diamond® may be used.

Figure 3A:
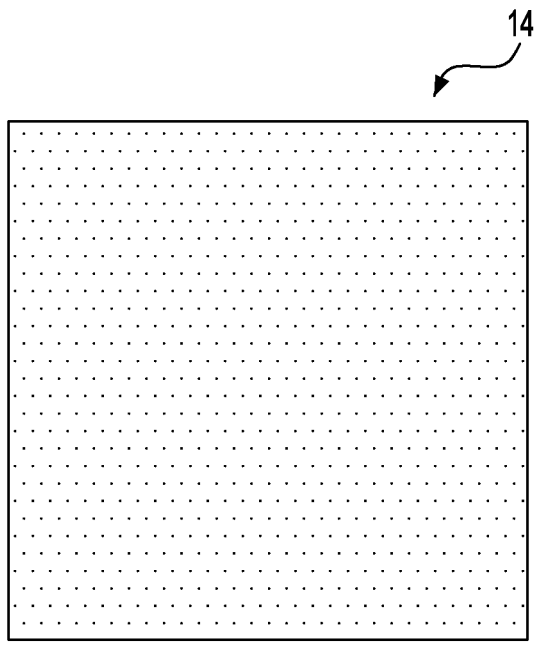
Figure 3B:
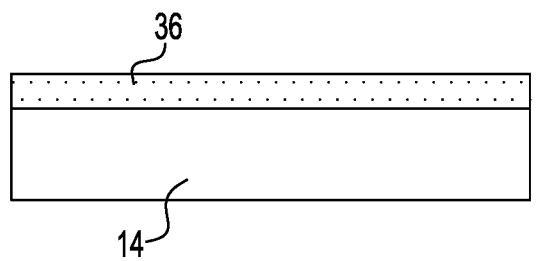

Referring now to FIGS. 3A and 3B to 8A and 8B, there is illustrated one exemplary embodiment in which a composite thermal interface material may be used. FIG. 3A is a plan view of the semiconductor device 14 having a blanket layer of a first thermal interface material 36 and FIG. 3B is a side view of the semiconductor device 14 in FIG. 3A. The first thermal interface material 36 is chosen to have high thermal conductivity as it will be positioned over the high region 28 shown in FIG. 2.

Figure 4A:
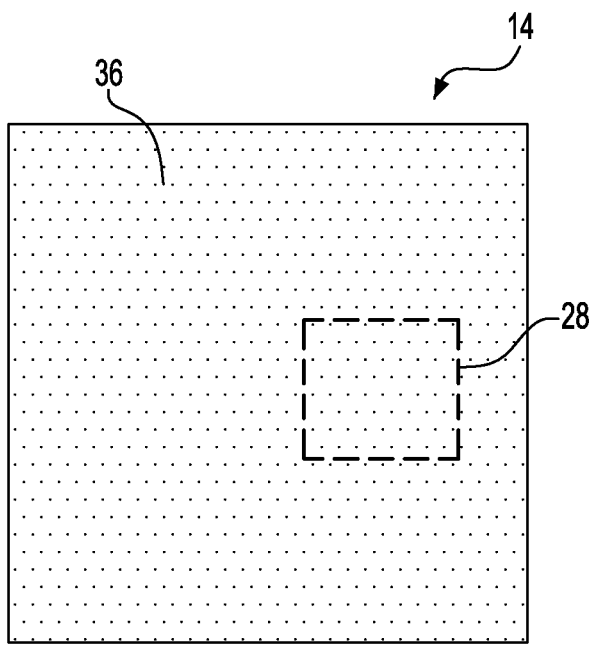
FIG. 4A is a plan view of the semiconductor device after having a portion of the first thermal interface material at least partially cured and FIG. 4B is a side view of the semiconductor device in FIG. 4A.
Figure 4B:
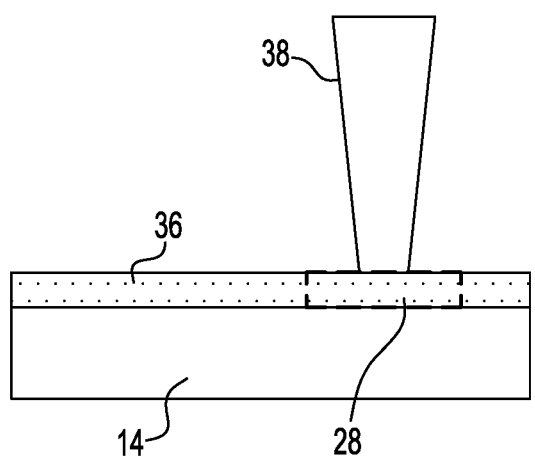

FIG. 4A is a plan view of the semiconductor device 14 and FIG. 4B is a side view of the semiconductor device 14 in FIG. 4A. The thermal interface material 36 is at least partially cured but may be fully cured as well. Whether the thermal interface material 36 is partially or fully cured may be determined from the curing instructions provided by the manufacturer of the thermal interface material 36.

The first thermal interface material 36 selected may be a photo-curable, laser-curable or heat-curable thermal interface material. As illustrated in FIG. 4B, the curing source 38 may be, for example, a laser or hot probe.

The curing source 38 may be, for example, raster scanned over the area to be partially or fully cured. In FIGS. 4A and 4B, the curing source 38 is pointed over region 28 to partially or fully cure the first thermal interface material 36 over region 28. The remaining first thermal interface material 36 outside of region 28 is uncured since it did not make contact with the curing source 38.

FIG. 5A is a plan view of the semiconductor device 14 after removal of the uncured first thermal interface material 36. The post-cured first thermal interface material 40 is shown after removal of the uncured first thermal interface material 36. FIG. 5B is a side view of the semiconductor device 14 in FIG. 5A.

A second thermal interface material 42 may be applied over the semiconductor device 14. The second thermal interface material 42 is chosen to have medium thermal conductivity as it will be positioned over the medium region 30 shown in FIG. 2. The second thermal interface material 42 selected may be a photo-curable, laser-curable or heat-curable thermal interface material. The curing source 38 again may be used to partially or fully cure the second thermal interface material 42. FIG. 6A is a plan view of the semiconductor device 14 after repeating the steps illustrated in FIGS. 3A and 4A for the second thermal interface material 42 and FIG. 6B is a side view of the semiconductor device 14 in FIG. 6A.

FIG. 7A is a plan view of the semiconductor device 14 after removal of the uncured second thermal interface material 42. The post-cured second thermal interface material 44 is shown after removal of the uncured second thermal interface material 42. FIG. 7B is a side view of the semiconductor device 14 in FIG. 7A.

FIG. 8A is a plan view of the semiconductor device 14 after repeating the steps previously described for third and fourth thermal interface materials. The third thermal interface material may be a low conductivity thermal interface material while the fourth thermal interface material may be a high compliance thermal interface material. That is, a third thermal interface material is applied and partially or fully cured over region 32 and then the uncured third thermal interface material is removed leaving the post-cured third thermal interface material 46. The foregoing steps are repeated for a fourth thermal interface material to leave the post-cured fourth thermal interface material 48 over region 34. FIG. 8B is a side view of the semiconductor device in FIG. 8A.

While this exemplary embodiment has been illustrated by applying the thermal interface materials in decreasing order of thermal conductivity, the order of applying the thermal interface materials is not critical. However, if the high thermal conductivity thermal interface material is a diamond-based particulate composite, which is usually more expensive than commercially available metal particle filled polymers, it may be desirable to apply it first so that the uncured portion of the high thermal conductivity thermal interface material that is removed may be recovered. More generally, the exemplary embodiments may enable recovery of any thermal interface material, if desired, with diamond-based particulate composite being the most likely target of this recovery process.

Referring now to FIGS. 9A and 9B to 16A and 16B, there is illustrated another exemplary embodiment in which a composite thermal interface material may be used. FIG. 9A is a plan view of the semiconductor device 14 having a blanket layer of a first thermal interface material 36 and an over layer of a lithographic masking material 50. FIG. 9B is a side view of the semiconductor device 14 in FIG. 9A. The first thermal interface material 36 is chosen to have high thermal conductivity as it will be positioned over the high region 28 shown in FIG. 2.

FIG. 10A is a plan view of the semiconductor device 14 and FIG. 10B is a side view of the semiconductor device 14 in FIG. 10A. The lithographic masking material 50 has been developed such that a portion is not cured and thus is removed, indicated by opening 52, to expose the underlying first thermal interface material 36. The first thermal interface material 36 is at least partially cured but may be fully cured as well. Whether the first thermal interface material 36 is partially or fully cured may be determined from the curing instructions provided by the manufacturer of the first thermal interface material 36.

The first thermal interface material 36 selected may be a photo-curable, laser-curable or heat-curable thermal interface material. As illustrated in FIG. 10B the curing source 38 may be, for example, a laser or hot probe.

The curing source 38 may be, for example, raster scanned over the area to be partially or fully cured. In FIGS. 10A and 10B the curing source 38 is pointed over region 28 to partially or fully cure the first thermal interface material 36 over region 28. The remaining first thermal interface material 36 outside of region 28 is uncured since it did not make contact with the curing source 38.

FIG. 11A is a plan view of the semiconductor device 14 after removal of the remaining lithographic masking material 50 and after removal of the uncured first thermal interface material 36. The post-cured first thermal interface material 40 is shown after removal of the remaining lithographic masking material 50 and after removal of the uncured first thermal interface material 36. FIG. 11B is a side view of the semiconductor device 14 in FIG. 11A.

FIG. 12A illustrates an optional step in which the partially cured first thermal interface material 40 is heated, as indicated by arrows 54, to fully cure the first thermal interface material 40 and FIG. 12B is a side view of the semiconductor device in FIG. 12A.

A second thermal interface material 42 may be applied over the semiconductor device 14. The second thermal interface material 42 is chosen to have medium thermal conductivity as it will be positioned over the medium region 30 shown in FIG. 2. The second thermal interface material 42 selected may be a photo-curable, laser-curable or heat-curable thermal interface material.

FIG. 13A is a plan view of the semiconductor device 14 after depositing the second thermal interface material 42 and depositing the lithographic masking material 50 and FIG. 13B is a side view of the semiconductor device of FIG. 13A;

FIG. 14A is a plan view of the semiconductor device 14 and FIG. 14B is a side view of the semiconductor device 14 in FIG. 14A. The lithographic masking material 50 has been developed such that a portion is not cured and thus is removed, indicated by opening 52, to expose the underlying second thermal interface material 42. The second thermal interface material 42 is at least partially cured but may be fully cured as well. Whether the second thermal interface material 42 is partially or fully cured may be determined from the curing instructions provided by the manufacturer of the second thermal interface material 42.

The second thermal interface material 42 selected may be a photo-curable, laser-curable or heat-curable thermal interface material. As illustrated in FIG. 14B, the curing source 38 may be, for example, a laser or hot probe.

The curing source 38 may be, for example, raster scanned over the area to be partially or fully cured. In FIGS. 14A and 14B, the curing source 38 is pointed over region 30 to partially or fully cure the second thermal interface material 42 over region 30. The remaining second thermal interface material 42 outside of region 30 is uncured since it did not make contact with the curing source 38.

FIG. 15A is a plan view of the semiconductor device 14 after removal of the remaining lithographic masking material 50 and after removal of the uncured second thermal interface material 42. The post-cured second thermal interface material 44 is shown after removal of the remaining lithographic masking material 50 and after removal of the uncured second thermal interface material 42. FIG. 15B is a side view of the semiconductor device 14 in FIG. 15A.

The optional heating step described with respect to FIGS. 12A and 12B may be performed here as well to fully cure the second thermal interface material 44.

FIG. 16A is a plan view of the semiconductor device 14 after repeating the steps previously described for third and fourth thermal interface materials. The third thermal interface material may be a low conductivity thermal interface material while the fourth thermal interface material may be a high compliance thermal interface material. That is, a third thermal interface material is applied. A lithographic masking material is applied and developed to expose the third thermal interface material over region 32. The third thermal interface material is partially or fully cured over region 32 and then the lithographic masking material and the uncured third thermal interface material are removed leaving the post-cured third thermal interface material 46. The foregoing steps are repeated for a fourth thermal interface material to leave the post-cured fourth thermal interface material 48 over region 34. FIG. 8B is a side view of the semiconductor device in FIG. 8A.

The optional heating step described in FIGS. 12A and 12B may also be applied after the partial curing of each of the third and fourth thermal interface materials.

While this exemplary embodiment has been illustrated by applying the thermal interface materials in decreasing order of thermal conductivity, the order of applying the thermal interface materials is not critical with one possible exception. If the high thermal conductivity thermal interface material is a diamond-containing thermal interface material, which is expensive due to the presence of diamonds, it may be desirable to apply it first so that the uncured portion of the high thermal conductivity thermal interface material that is removed may be recovered.

Moreover, this exemplary embodiment has the advantage of the lithographic masking material which may sharply define each of the cured thermal interface materials.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A semiconductor device comprising:
    a semiconductor substrate having a surface, the surface having a plurality of regions having different thermal and/or mechanical requirements; and
    a composite thermal interface material comprising a plurality of spatially localized thermal interface materials placed on the surface, each of the plurality of thermal interface materials tailored to the different thermal and/or mechanical requirements of each of the plurality of regions and each of the plurality of thermal interface materials being limited to partially or fully cured thermal interface materials.

2. The semiconductor device of claim 1 wherein the plurality of spatially localized thermal interface materials are placed directly in contact with one another such that the composite thermal interface material has no gaps between adjacent thermal interface materials.

3. The semiconductor device of claim 1 wherein each of the spatially localized thermal interface materials is homogeneous in composition.

4. The semiconductor device of claim 1 further comprising a lid in direct contact with the spatially localized thermal interface materials.

5. A semiconductor device comprising:
    a semiconductor substrate having a surface, the surface having a plurality of regions having different thermal and/or mechanical requirements; and
    a composite thermal interface material comprising a plurality of spatially localized thermal interface materials placed on the surface, each of the plurality of thermal interface materials tailored to the different thermal and/or mechanical requirements of each of the plurality of regions, wherein one of the spatially localized thermal interface materials has a first thermal conductivity and is placed on a first region of the plurality of region and having first thermal requirements, one of the spatially localized thermal interface materials has a second thermal conductivity and is placed on a second region of the plurality of regions and having second thermal requirements and one of the spatially localized thermal interface materials has a third thermal conductivity and is placed on a third region of the plurality of regions and having third thermal requirements wherein the first thermal conductivity is higher than the second thermal conductivity which is higher than the third thermal conductivity and wherein the spatially localized thermal interface material placed on the third region has high mechanical compliance and low modulus compared to the spatially localized thermal interface materials placed on the first region and the second region.

6. The semiconductor device of claim 1 wherein one of the spatially localized thermal interface materials has a first thermal conductivity and is placed on a first region of the plurality of regions and having first thermal requirements and one of the spatially localized thermal interface materials has a second thermal conductivity and is placed on a second region of the plurality of regions and having second thermal requirements wherein the first thermal conductivity is higher than the second thermal conductivity.

7. A method of thermal interface material deposition on a surface of a semiconductor device comprising the steps of:
depositing a thermal interface material on the surface of the semiconductor device, the thermal interface material selected from a plurality of thermal interface materials having different thermal conductivities;
curing a portion of the deposited thermal interface material, a remaining portion of the deposited thermal interface material being uncured;
stripping the remaining portion of the deposited thermal interface material to result in a spatially localized portion of cured thermal interface material;
repeating the steps of depositing, curing and stripping such that each time the steps are repeated, a different thermal interface material is deposited, cured and stripped; and
continuing the repeating until the surface of the semiconductor device is covered with the cured thermal interface materials to form a composite thermal interface material comprising a plurality of spatially localized thermal interface materials having different thermal and/or mechanical requirements placed on the surface, each of the plurality of thermal interface materials tailored to the different thermal and/or mechanical requirements of each of the plurality of regions and each of the plurality of thermal interface materials being limited to partially or fully cured thermal interface materials.

8. The method of claim 7 wherein the cured thermal interface materials are placed directly in contact with one another such that the cured thermal interface materials have no gaps between adjacent cured thermal interface materials.

9. The method of claim 7 wherein each of the spatially localized cured thermal interface materials is homogeneous in composition.

10. The method of claim 7 wherein there are three different thermal interface materials such that one of the spatially localized thermal interface materials has a first thermal conductivity and is placed on a first region of the plurality of region and having first thermal requirements, one of the spatially localized thermal interface materials has a second thermal conductivity and is placed on a second region of the plurality of regions and having second thermal requirements and one of the spatially localized thermal interface materials has a third thermal conductivity and is placed on a third region of the plurality of regions and having third thermal requirements wherein the first thermal conductivity is higher than the second thermal conductivity which is higher than the third thermal conductivity.

11. The method of claim 10 wherein the spatially localized thermal interface material placed on the third region has high mechanical compliance and low modulus compared to the spatially localized thermal interface materials placed on the first region and the second region.

12. The method of claim 7 wherein there are two different thermal interface materials such that one of the spatially localized thermal interface materials has a first thermal conductivity and is placed on a first region of the plurality of region and having first thermal requirements and one of the spatially localized thermal interface materials has a second thermal conductivity and is placed on a second region of the plurality of regions wherein the first thermal conductivity is higher than the second thermal conductivity.

13. The method of claim 7 wherein between the steps of depositing and curing further comprising:
depositing a lithographic masking material over the thermal interface material; and
forming an opening in the lithographic masking material to expose the underlying thermal interface material;
wherein the step of curing includes curing the thermal interface material through the opening in the lithographic masking material;
wherein the step of stripping includes stripping the lithographic masking material; and
wherein the step of repeating includes repeating the steps of depositing a lithographic masking material and forming an opening in the lithographic masking material.

14. A method of thermal interface material deposition on a surface of a semiconductor device comprising the steps of:
depositing a thermal interface material on the surface of the semiconductor device, the thermal interface material selected from a plurality of thermal interface materials having different thermal conductivities;
depositing a lithographic masking material over the thermal interface material;
forming an opening in the lithographic masking material to expose the underlying thermal interface material;
curing a portion of the deposited thermal interface material through the opening in the lithographic masking material, a remaining portion of the deposited thermal interface material being uncured;
stripping the lithographic masking material and the remaining portion of the deposited thermal interface material to result in a spatially localized portion of cured thermal interface material;
repeating the steps of depositing a thermal interface material, depositing a lithographic masking material, curing and stripping such that each time the steps are repeated, a different thermal interface material is deposited, cured and stripped; and
continuing the repeating until the surface of the semiconductor device is covered with the cured thermal interface materials to form a composite thermal interface material comprising a plurality of spatially localized thermal interface materials having different thermal and/or mechanical requirements placed on the surface, each of the plurality of thermal interface materials tailored to the different thermal and/or mechanical requirements of each of the plurality of regions and each of the plurality of thermal interface materials being limited to partially or fully cured thermal interface materials.

15. The method of claim 14 wherein each of the spatially localized cured thermal interface materials is homogeneous in composition.

16. The method of claim 14 wherein there are three different thermal interface materials such that one of the spatially localized thermal interface materials has a first thermal conductivity and is placed on a first region of the plurality of region and having first thermal requirements, one of the spatially localized thermal interface materials has a second thermal conductivity and is placed on a second region of the plurality of regions and having second thermal requirements and one of the spatially localized thermal interface materials has a third thermal conductivity and is placed on a third region of the plurality of regions and having third thermal requirements wherein the first thermal conductivity is higher than the second thermal conductivity which is higher than the third thermal conductivity.

17. The method of claim 16 wherein the spatially localized thermal interface material placed on the third region has high mechanical compliance and low modulus compared to the spatially localized thermal interface materials placed on the first region and the second region.

18. The method of claim 14 wherein there are two different thermal interface materials such that one of the spatially localized thermal interface materials has a first thermal conductivity and is placed on a first region of the plurality of region and having first thermal requirements and one of the spatially localized thermal interface materials has a second thermal conductivity and is placed on a second region of the plurality of regions wherein the first thermal conductivity is higher than the second thermal conductivity.

* * * * *